(12) United States Patent
Sills

(10) Patent No.: US 12,241,621 B2
(45) Date of Patent: *Mar. 4, 2025

(54) SOLID STATE LIGHTS WITH COOLING STRUCTURES

(71) Applicant: Micron Technology, Inc., Boise, ID (US)

(72) Inventor: Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/439,670

(22) Filed: Feb. 12, 2024

(65) Prior Publication Data

US 2024/0183522 A1 Jun. 6, 2024

Related U.S. Application Data

(63) Continuation of application No. 18/194,907, filed on Apr. 3, 2023, now Pat. No. 11,898,733, which is a continuation of application No. 17/728,780, filed on Apr. 25, 2022, now Pat. No. 11,619,375, which is a continuation of application No. 17/107,720, filed on
(Continued)

(51) Int. Cl.
| | | |
|---|---|---|
| *F21V 29/00* | (2015.01) | |
| *F21V 7/00* | (2006.01) | |
| *F21V 9/30* | (2018.01) | |
| *F21V 13/14* | (2006.01) | |
| *F21V 29/67* | (2015.01) | |
| *F21V 29/83* | (2015.01) | |
| *F21V 7/05* | (2006.01) | |
| *F21V 13/04* | (2006.01) | |
| *F21V 29/507* | (2015.01) | |
| *F21V 29/74* | (2015.01) | |
| *F21V 29/80* | (2015.01) | |
| *F21Y 115/10* | (2016.01) | |

(Continued)

(52) U.S. Cl.
CPC ............ *F21V 29/67* (2015.01); *F21V 7/0008* (2013.01); *F21V 9/30* (2018.02); *F21V 13/14* (2013.01); *F21V 29/673* (2015.01); *F21V 29/83* (2015.01); *F21V 7/005* (2013.01); *F21V 7/05* (2013.01); *F21V 13/04* (2013.01); *F21V 29/507* (2015.01); *F21V 29/74* (2015.01); *F21V 29/80* (2015.01); *F21Y 2115/10* (2016.08); *H01L 33/48* (2013.01); *H01L 33/60* (2013.01)

(58) Field of Classification Search
None
See application file for complete search history.

(56) References Cited

U.S. PATENT DOCUMENTS

| | | |
|---|---|---|
| 6,161,946 A | 12/2000 | Bishop et al. |
| 6,517,218 B2 | 2/2003 | Hochstein |

(Continued)

*Primary Examiner* — Gerald J Sufleta, II
(74) *Attorney, Agent, or Firm* — Perkins Coie LLP

(57) ABSTRACT

A solid state lighting (SSL) with a solid state emitter (SSE) having thermally conductive projections extending into an air channel, and methods of making and using such SSLs. The thermally conductive projections can be fins, posts, or other structures configured to transfer heat into a fluid medium, such as air. The projections can be electrical contacts between the SSE and a power source. The air channel can be oriented generally vertically such that air in the channel warmed by the SSE flows upward through the channel.

16 Claims, 9 Drawing Sheets

Related U.S. Application Data

Nov. 30, 2020, now Pat. No. 11,353,206, which is a continuation of application No. 16/416,237, filed on May 19, 2019, now Pat. No. 10,883,710, which is a continuation of application No. 15/728,054, filed on Oct. 9, 2017, now Pat. No. 10,408,443, which is a continuation of application No. 12/855,492, filed on Aug. 12, 2010, now Pat. No. 9,810,418.

(51) Int. Cl.
  *H01L 33/48* (2010.01)
  *H01L 33/60* (2010.01)

(56) References Cited

U.S. PATENT DOCUMENTS

| | | | |
|---|---|---|---|
| 6,682,211 B2 | 1/2004 | English et al. | |
| 7,021,807 B2 * | 4/2006 | Chew | F21V 3/04 362/240 |
| 7,144,135 B2 | 12/2006 | Martin et al. | |
| 7,329,033 B2 | 2/2008 | Glovatsky et al. | |
| 7,427,152 B2 | 9/2008 | Erion et al. | |
| 7,677,770 B2 | 3/2010 | Mazzochette | |
| 7,934,851 B1 | 5/2011 | Boissevain et al. | |
| 9,810,418 B2 | 11/2017 | Sills | |
| 10,408,443 B2 | 9/2019 | Sills | |
| 10,883,710 B2 | 1/2021 | Sills | |
| 11,353,206 B2 | 6/2022 | Sills | |
| 11,619,375 B2 | 4/2023 | Sills | |
| 2004/0165380 A1 * | 8/2004 | Chew | F21V 5/02 362/235 |
| 2006/0193139 A1 | 8/2006 | Sun et al. | |
| 2006/0215416 A1 | 9/2006 | Lucas et al. | |
| 2007/0242453 A1 | 10/2007 | Suzuki | |
| 2009/0175041 A1 | 7/2009 | Yuen et al. | |
| 2009/0180290 A1 | 7/2009 | Grajcar | |
| 2009/0190352 A1 | 7/2009 | Van Tertholen et al. | |
| 2009/0296416 A1 | 12/2009 | Luo et al. | |
| 2010/0020537 A1 | 1/2010 | He et al. | |
| 2010/0060130 A1 | 3/2010 | Li | |
| 2010/0072505 A1 | 3/2010 | Gingrich | |
| 2010/0188017 A1 | 7/2010 | Brukilacchio | |
| 2010/0195306 A1 | 8/2010 | Helbing et al. | |
| 2010/0254133 A1 | 10/2010 | Cheng | |
| 2011/0063843 A1 | 3/2011 | Cook | |
| 2011/0148329 A1 | 6/2011 | Demarest et al. | |
| 2011/0156584 A1 | 6/2011 | Kim | |
| 2011/0228550 A1 | 9/2011 | Robinson | |
| 2011/0267829 A1 | 11/2011 | Horng et al. | |
| 2012/0008330 A1 | 1/2012 | Horng et al. | |
| 2012/0037926 A1 | 2/2012 | Sills et al. | |
| 2012/0051054 A1 | 3/2012 | Kauffman et al. | |
| 2012/0051055 A1 | 3/2012 | Kauffman et al. | |
| 2012/0114995 A1 | 5/2012 | Qiu et al. | |
| 2012/0212960 A1 | 8/2012 | Rodriguez | |
| 2012/0218773 A1 | 8/2012 | Peiler et al. | |
| 2018/0031224 A1 | 2/2018 | Sills | |
| 2019/0271459 A1 | 9/2019 | Sills | |
| 2021/0080095 A1 | 3/2021 | Sills | |
| 2022/0252245 A1 | 8/2022 | Sills | |
| 2023/0250948 A1 | 8/2023 | Sills | |

* cited by examiner

SOLID STATE LIGHTS WITH COOLING STRUCTURES

CROSS-REFERENCE TO RELATED APPLICATION

This application is a continuation of U.S. patent application Ser. No. 18/194,907, filed Apr. 3, 2023; which is a continuation of U.S. patent application Ser. No. 17/728,780, filed Apr. 25, 2022, now U.S. Pat. No. 11,619,375; which is a continuation of U.S. patent application Ser. No. 17/107,720, filed Nov. 30, 2020, now U.S. Pat. No. 11,353,206; which is a continuation of U.S. patent application Ser. No. 16/416,237, filed May 19, 2019, now U.S. Pat. No. 10,883,710; which is a continuation of U.S. patent application Ser. No. 15/728,054, filed Oct. 9, 2017, now U.S. Pat. No. 10,408,443; which is a continuation of U.S. patent application Ser. No. 12/855,492, filed Aug. 12, 2010, now U.S. Pat. No. 9,810,418; each of which is incorporated herein by reference in its entirety.

TECHNICAL FIELD

The present technology is related to solid state lighting (SSL) devices and associated methods of operation and manufacture. In particular, the present technology is related to cooling SSL devices with one or more solid state emitters (SSEs), such as light emitting diodes.

BACKGROUND

SSL devices and SSEs are increasingly in demand for many purposes because SSEs efficiently produce high-intensity, high-quality light. Mobile phones, personal digital assistants, digital cameras, MP3 players, and other portable devices use SSL devices for background illumination. Applications for SSL devices extend beyond portable electronic devices and include many types of lights, such as ceiling panels, desk lamps, refrigerator lights, table lamps, street lights, and automobile headlights.

There are several types of SSEs, such as semiconductor light-emitting diodes (LEDs), polymer light-emitting diodes (PLEDs), and organic light-emitting diodes (OLEDs). Generally, SSEs generate less heat, provide greater resistance to shock and vibration, and have longer life spans than conventional lighting devices that use filaments, plasma, or gas as sources of illumination (e.g., florescent tubes and incandescent light bulbs).

A conventional type of SSE is a "white light" LED. White light requires a mixture of wavelengths to be perceived as such by human eyes. However, LEDs typically only emit light at one particular wavelength (e.g., blue light), so LEDs must be modified to emulate white light. One conventional technique for doing so includes depositing a converter material (e.g., phosphor) on the LED. For example, as shown in FIG. 1A, a conventional SSL device 10 includes a support 2 carrying an LED 4 and a converter material 6 deposited on the LED 4. The LED 4 can include one or more light emitting components. FIG. 1B is a cross-sectional diagram of a portion of a conventional indium-gallium nitride LED 4. As shown in FIG. 1B, the LED 4 includes a substrate 12, an N-type gallium nitride (GaN) material 14, an indium gallium nitride (InGaN) material 16 (and/or GaN multiple quantum wells), and a P-type GaN material 18 on one another in series. Conventional substrates 12 are comprised of sapphire or silicon. The LED 4 can further include a first contact 20 on the P-type GaN material 18 and a second contact 22 on the N-type GaN material 14. Referring to both FIGS. 1A and 1B, in operation, the InGaN material 16 of the LED 4 emits a blue light that stimulates the converter material 6 to emit a light (e.g., a yellow light) at a desired frequency. The combination of the blue and yellow emissions appears white to human eyes if matched appropriately.

Another conventional construction of an SSL device 21 is shown in FIG. 2. The SSL device 21 has a support 23 upon which a plurality of LEDs 24 are mounted. The device 21 also includes a converter material 26, and a lens 28 formed over the LEDs 24. The converter material 26 can be formed directly on the lens 28 as shown in FIG. 2, or the converter material 26 can be formed elsewhere such that light from the LEDs 24 passes through the converter material 26.

Although LEDs produce less heat than conventional lighting devices, LEDs can produce enough heat to increase the rate at which some of the heat sensitive semiconductor and optical components deteriorate. The converter material 6, for example, deteriorates relatively rapidly at higher temperatures such that over time the converter material 6 emits light at a different frequency than the desired frequency. The combined emissions accordingly appear off-white and may reduce the color fidelity of electronic devices. The junctions between semiconductor materials that produce the light also deteriorate at higher temperatures. Therefore, it would be desirable to improve the cooling in SSEs and/or SSL devices.

DETAILED DESCRIPTION

Various embodiments of solid state lights ("SSLs") and associated methods of manufacturing SSLs are described below. The term "SSL" generally refers to "solid state light" and/or "solid state lighting" according to the context in which it is used. The terms "SSL emitter" or "solid state emitter" ("SSE") generally refer to solid state components that convert electrical energy into electromagnetic radiation in the visible, ultraviolet, infrared and/or other spectra. SSEs include light-emitting diodes (LEDs), which are semiconductor diodes that convert electrical energy into electromagnetic radiation in a desired spectrum. SSEs can also include polymer light-emitting diodes (PLEDs) and organic light-emitting diodes (OLEDs). The term "phosphor" generally refers to a material that can continue emitting light after exposure to energy (e.g., electrons and/or photons). A person skilled in the relevant art will understand that the new technology may have additional embodiments and that the new technology may be practiced without several of the details of the embodiments described below with reference to FIGS. 3A-7.

Figure 1A:
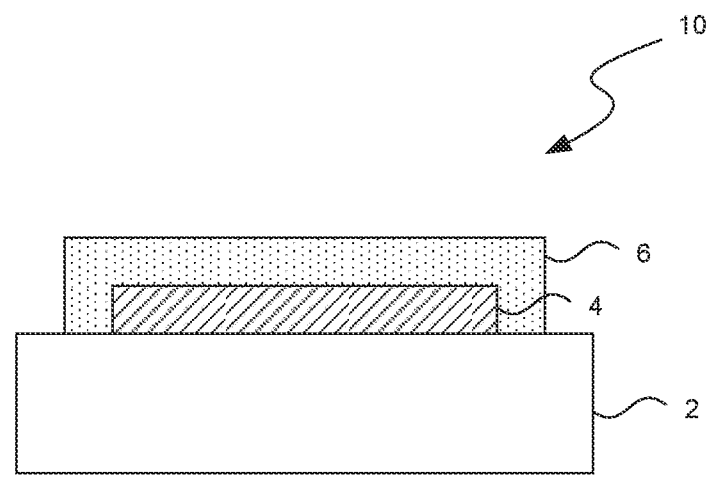
FIG. 1A is a partially schematic cross-sectional view of an SSL device in accordance with the prior art.
Figure 1B:
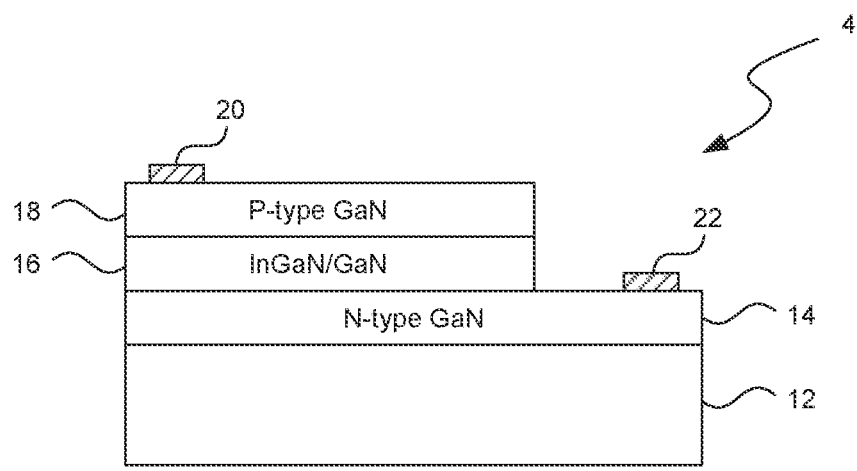
FIG. 1B is a partially schematic cross-sectional view of an LED in accordance with the prior art.
Figure 2:
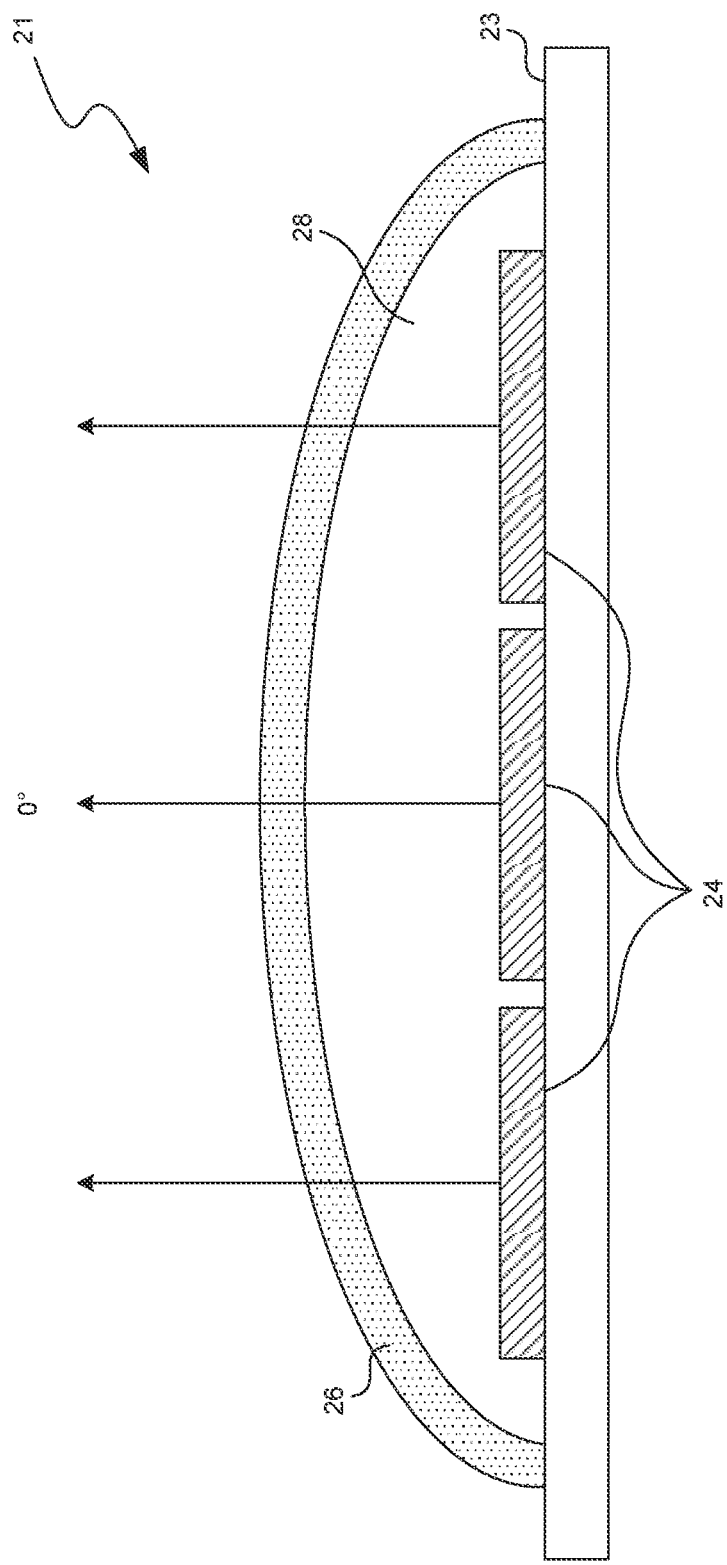
FIG. 2 is a partially schematic cross-sectional view of an SSL device in accordance with the prior art.
Figure 3A:
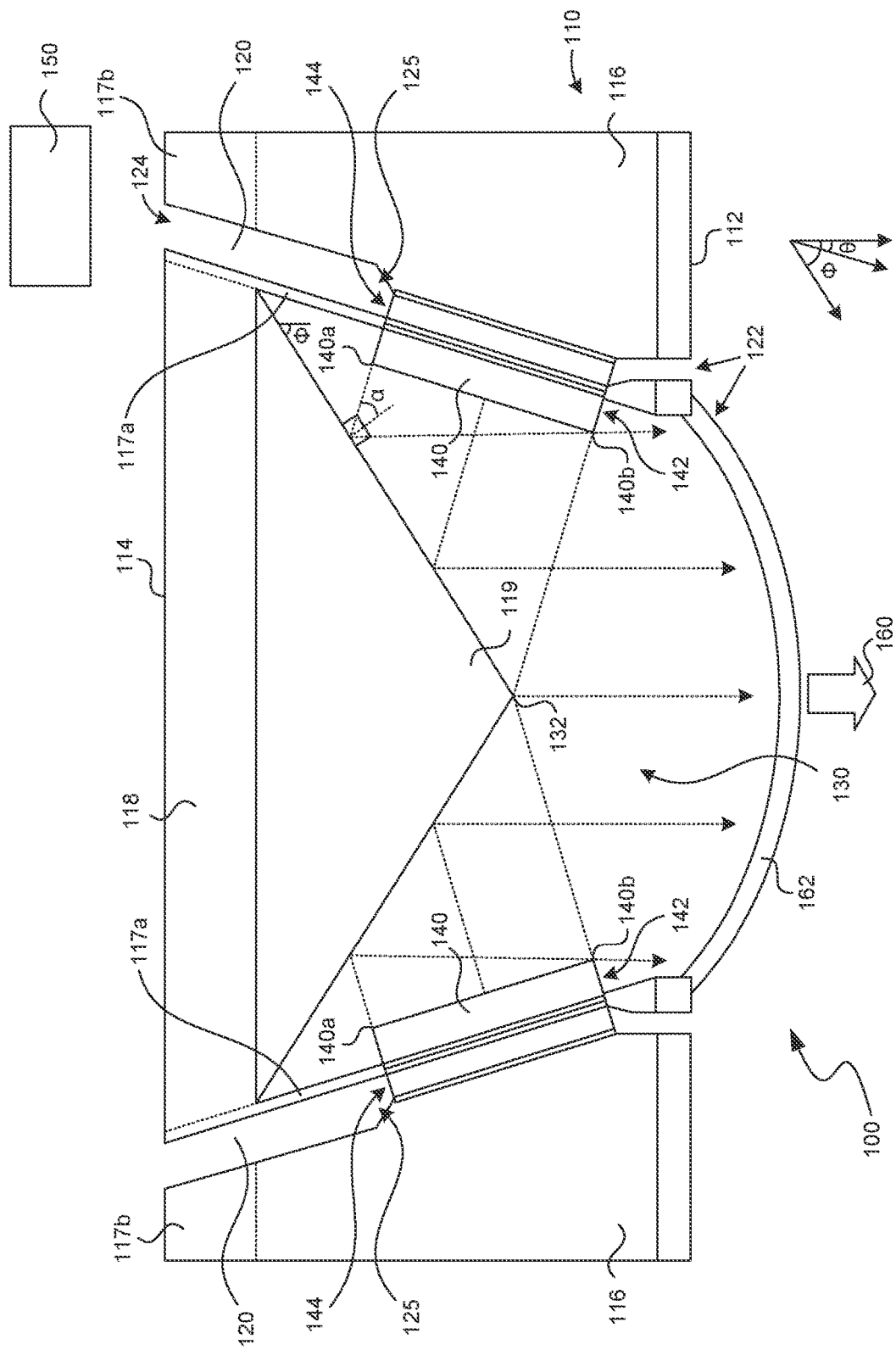
FIG. 3A is a partially schematic cross-sectional view of an SSL device in accordance with an embodiment of the present technology.

FIG. 3A is a partially schematic side cross-sectional view of an SSL device 100 according to several embodiments of the present technology. The SSL device 100 can include a housing 110 having a front 112, a back 114, a side section 116 between the front 112 and the back 114, and a base 118 at the back 114. The side section 116 can include an inner wall 117a, an outer wall 117b, and a channel 120 passing through the side section 116 between the inner and outer walls 117a, 117b. The channel 120 can have an inlet 122 at the front 112 of the housing 110 and an outlet 124 at the back 114 of the housing 110. The housing 110 can also include a chamber 130 defined by the inner wall 117a of the side section 116 and the base 118. The SSL device 100 can further include a reflector 119 mounted to the base 118 in the chamber 130, and a plurality of SSEs 140 mounted to the side section 116 to face the reflector 119. As described in more detail below, the SSEs 140 can have an active portion 142 that emits light toward the reflector 119 and a back portion 144 mounted to the side section 116. The reflector 119 directs the light from the SSEs 140 along a primary output direction 160, and the SSL device 100 can also include a lens 162 over the chamber 130 in the optical path of the primary output direction 160.

In several embodiments the SSEs 140 can be positioned and angled relative to the reflector 119 such that the reflector 119 directs substantially all of the light out of the SSL device 100. For example, the SSEs 140 can emit light directed principally in one direction normal to the surface of the active portions 142 of the SSEs 140. It is generally advantageous to output as much light as possible from the SSL device 100 and still have a compact design. As such, the SSEs 140 can be positioned relative to the reflector 119 such that the reflector 119 directs light from a first edge 140a of the SSEs 140 past a second edge 140b of the SSEs 140. Additionally, the SSEs 140 and reflector can be configured such that light from the second edge 140b of the SSEs 140 is directed at an apex 132 of the reflector 119 to prevent light from the second edge 140b of the SSEs 140 from missing the reflector 119 and striking an opposing SSE 140 (or other component). This arrangement outputs more light from the SSL device 100 and avoids accumulating additional heat in the SSL device 100 that would otherwise occur if light were reflected back into the SSL device 100. In some embodiments, the reflector 119 can be angled relative to the primary direction 160 by a first angle ($\Phi$). The front 142 of the SSEs 140 can be angled relative to the primary direction 160 by a second angle ($\theta$) and the reflector 119 and the front 142 can be angled relative to one another by a third angle ($\alpha$). The first angle ($\Phi$) can be approximately equal to the second angle ($\theta$) plus the third angle ($\alpha$).

In several embodiments, at least a portion of the SSEs 140 is exposed to the channel 120 in the side section 116. For example, the back 144 of the SSEs 140 can be exposed in the channel 120. The channel 120 can be oriented at a sufficiently high angle relative to horizontal such that air in the channel 120 heated by the SSEs 140 rises and draws cool air into the lower portion of the channel to produce a passive, natural cooling flow of air across a surface of the SSEs 140. In several embodiments, the SSEs 140 can be mounted generally parallel with the channel 120. In other embodiments, the SSEs 140 are not necessarily parallel with the channel 120, but can be mounted at a sufficient angle relative to horizontal such that heated air in the channel 120 rises and causes the cooling air flow through the channel 120.

In several embodiments, at least one of the inlet 122 and the outlet 124 is open to ambient air that is sufficiently cooler than the SSEs 140 to maintain the temperature of the SSEs 140 within a desired operating range. In some applications, an air pressurizer 150, such as a fan, (shown conceptually in FIGS. 3A and 5) can be positioned near the inlet 122, the outlet 124, or at both the inlet 122 and the outlet 124 to actively drive the cooling air through the channel 120. The air pressurizer 150 can also be within the channel 120. Depending on the position of the air pressurizer 150 relative to the inlet 122 and outlet 124, the air pressurizer can create positive pressure to "push" air into the inlet 122, or negative pressure to "pull" air from the outlet 124. If the air pressurizer 150 is within the channel 120, of course, the air pressurizer can create positive pressure between the air pressurizer 150 and the outlet 124, and negative pressure between the air pressurizer 150 and the inlet 122. The channel 120 can have a first width near the inlet 122 and a second width near the outlet 124 to create advantageous air pressure in the channel 120. For example, the first width can be smaller than the second width to create a Joule-Thomson expansion zone 125 in the channel 120 to further draw air into the channel 120.

Figure 3B:
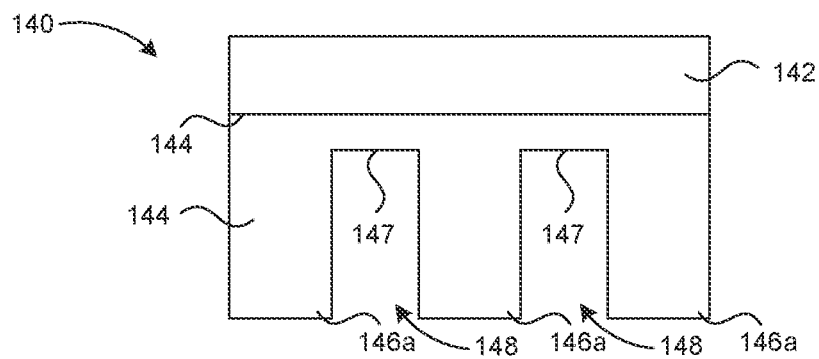
FIG. 3B is a partially schematic side view of an SSE having thermally conductive projections in accordance with embodiments of the present technology.
Figure 3C:
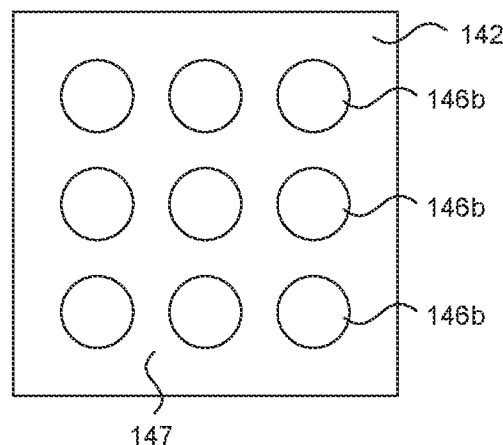
FIG. 3C is a partially schematic back view of an SSE having thermally conductive projections in accordance with embodiments of the present technology.
Figure 3D:
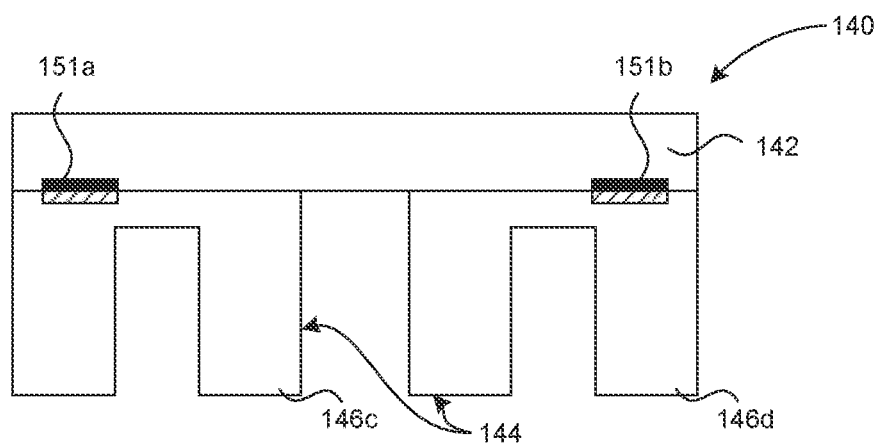
FIG. 3D is a partially schematic side view of an SSE having thermally conductive projections and electrical contacts in accordance with embodiments of the present technology.

The back portion 144 of the SSEs 140 can include a heat sink made of a thermally and/or electrically conductive material, such as copper (Cu), aluminum (Al), or a highly thermally conductive alloy. In several embodiments, the back portion 144 can include projections 146, such as fins, posts, or other features that increase the thermally conductive surface area of the back portion 144. FIGS. 3B-D illustrate several configurations of the projections 146 according to embodiments of the present technology. FIG. 3B shows a cross-sectional view of an embodiment of a back portion 144 having a shallow section 147 covering the backside of the active portion 142 and several elongated, generally rectilinear projections 146a extending from the shallow section 147. Alternatively, back portion 144 does not need to have the shallow section 147 such that the individual projections 146a can be separated from one another with the backside of the active portion 142 exposed between the projections 146a. The projections 146a can define conduits 148 parallel to the airflow through the channel 120 (FIG. 3A), or they can be angled or otherwise non-parallel with the airflow in the channel 120 according to known heat transfer techniques.

FIG. 3C is a view of another embodiment of the back portion 144 of the SSE 140 that includes projections 146b comprising a plurality of posts extending from the backside of the active portion 142 of the SSE 140. The projections 146b can be arranged in rows and columns, or they can be staggered in other arrangements. As with other embodiments, the projections 146*b* can project from a shallow section integral with the projections 146*b*.

Other suitable heat-exchanging structures can be associated with the SSE 140. For example, FIG. 3D illustrates another embodiment of the present technology in which the back portion 144 includes projections 146*c* and 146*d* made from an electrically conductive material. The active portion 142 of the SSE 140 can include electrical contacts 151*a* and 151*b* (e.g., n and p contacts) that are electrically coupled to the projection portions 146*c* and 146*d*, respectively. In other embodiments, the projections 146*c* and 146*d* can be made from a dielectric material and include interconnects electrically connected to the electrical contacts 151*a*, 151*b*.

Figure 4A:
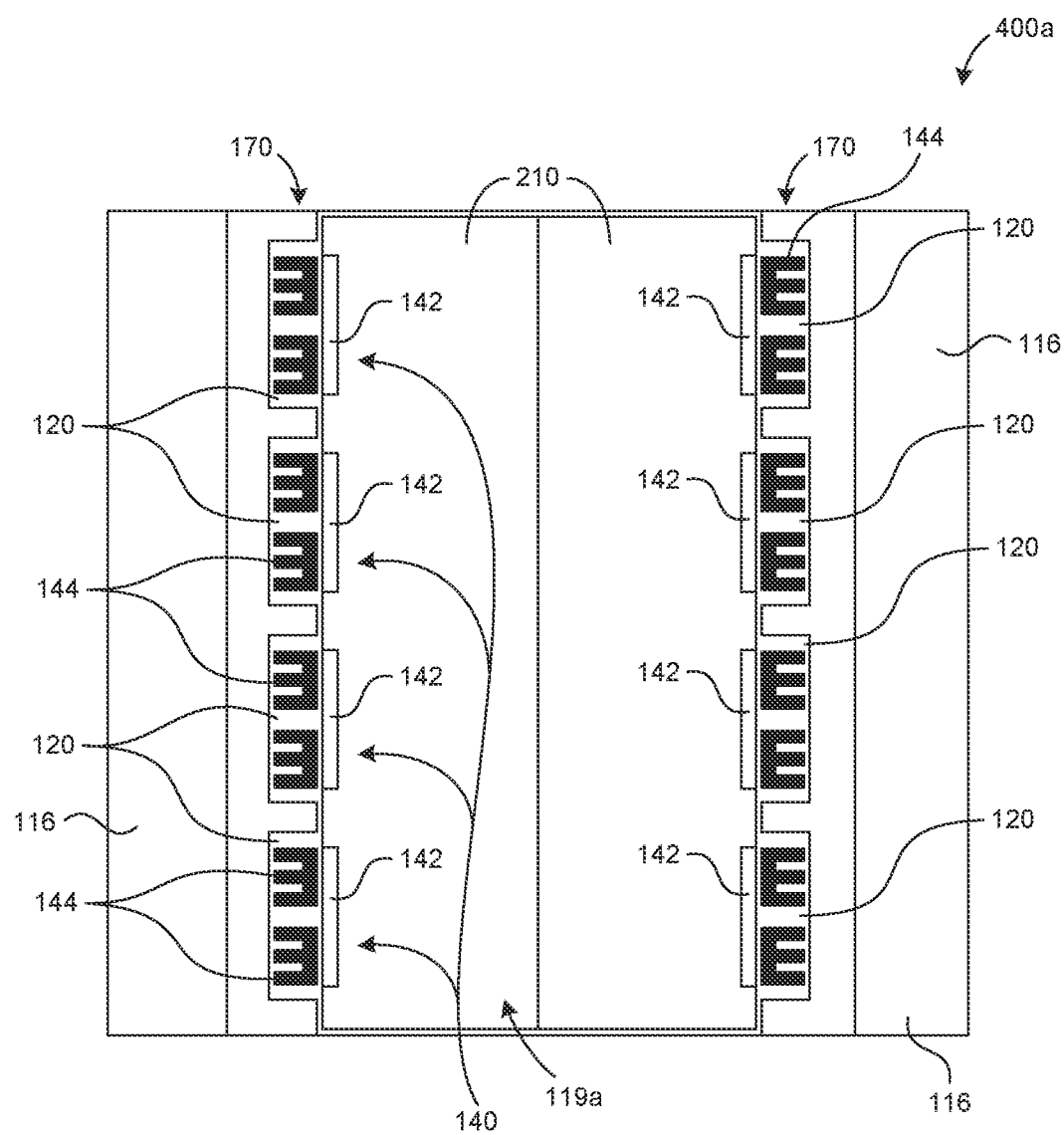
FIG. 4A is a partially schematic bottom plan view of a rectangular SSL device in accordance with an embodiment of the present technology.
Figure 4B:
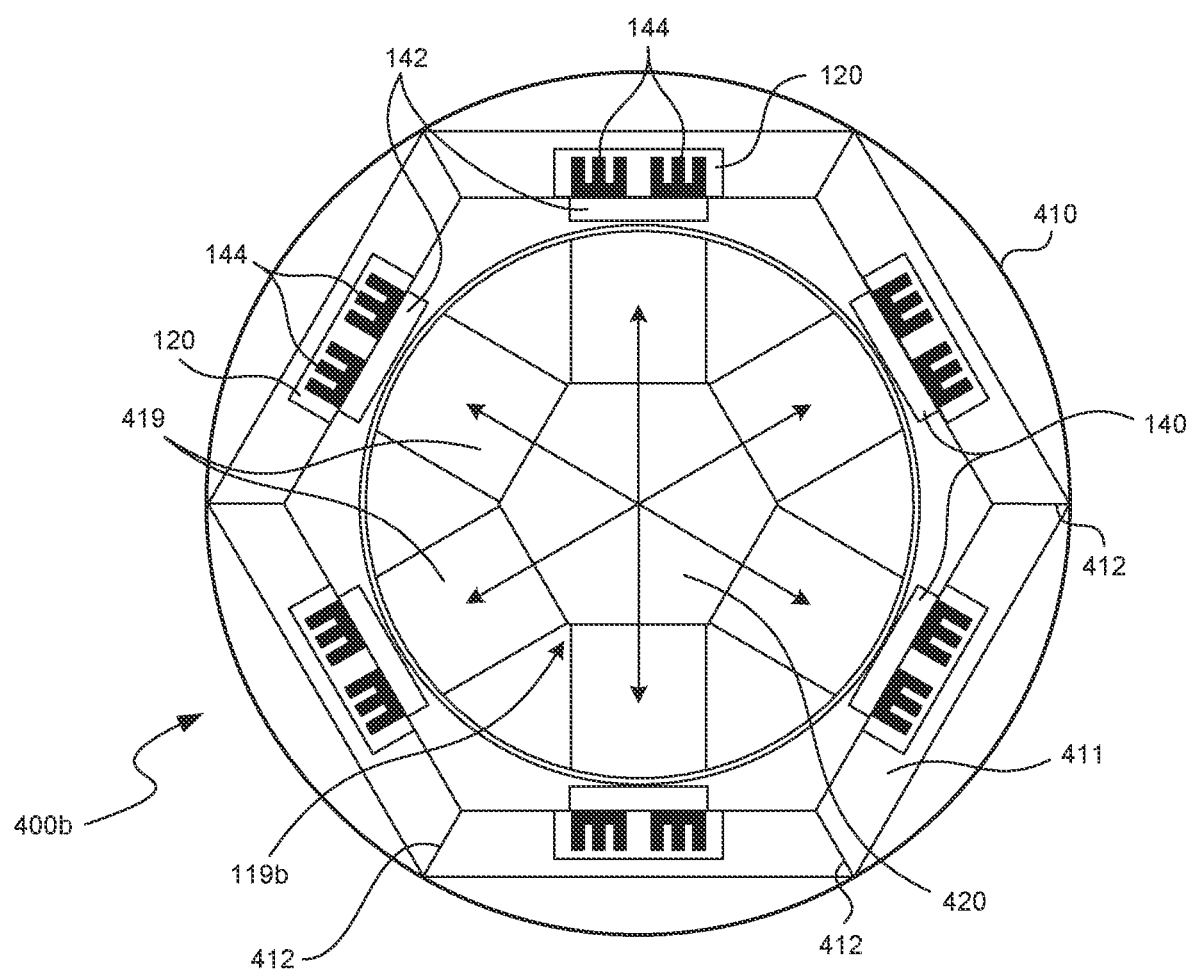
FIG. 4B is a partially schematic bottom plan view of a circular SSL device in accordance with another embodiment of the present technology.

FIGS. 4A and 4B are bottoms plan views of specific embodiments of SSL devices 400*a* and 400*b*, respectively. More specifically, the SSL device 400*a* in FIG. 4A is generally rectilinear, and the SSL device 400*b* shown in FIG. 4B can be either hexagonal or circular. Like reference numbers generally refer to similar or even identical components in FIGS. 3A, 4A and 4B.

Referring to FIG. 4A, the SSL device 400*a* includes an elongated reflector 119*a* composed of two generally flat, rectangular reflective surfaces 210. In this embodiment, the SSL device 400*a* has separate side sections 116, and each side section 116 has a plurality of channels 120. The SSEs 140 can be arranged in rows 170 flanking each surface 210 of the reflector 119*a* such that the active portions 142 face the reflective surfaces 210 and the back portion 144 are in or otherwise exposed to the channels 120. The SSL device 400*a* can include any suitable number of SSEs 140 arranged in the rows 170. As explained above, the SSEs 140 heat the air in the channels 120, which in turn draws cooler ambient air into the channels 120 and across the back portions 144 to cool the SSEs 140.

Referring to FIG. 4B, the SSL device 400*b* has a rounded or circular housing 410 and a reflector 119*b*. The reflector 119*b* can be conical or faceted (e.g., pyramidal). The reflector 119*b* of the SSL device 400*b* shown in FIG. 4B, for example, is faceted and includes six facets 419 configured to reflect the light from six corresponding SSEs 140. In other embodiments, however, the SSL device 400*b* can include any suitable number of facets and SSEs 140. The reflector 119*b* can also be a truncated faceted structure with a flat top surface 420 defining the apex.

The SSL device 400*b* can also have a planar support 411 that has beveled edges 412. The angle of the beveled edges 412 can vary according to the number of sides. For example, a configuration with six sides has bevels of 60°. The beveled edges 412 of neighboring supports 411 can abut one another around the SSL device 400. The SSL device 400*b* can also have one or more SSEs 140 mounted to the planar supports 411. In one embodiment, the SSEs 140 can be mounted to the planar supports 411 using conventional planar mounting techniques and equipment while the supports 411 are flat and before the supports 411 are joined to the SSL device 400*b*. As with other embodiments shown and described above, the SSL device 400*b* can include one or more channels 120 through which cooling air can be drawn to cool the SSEs 140.

Figure 5:
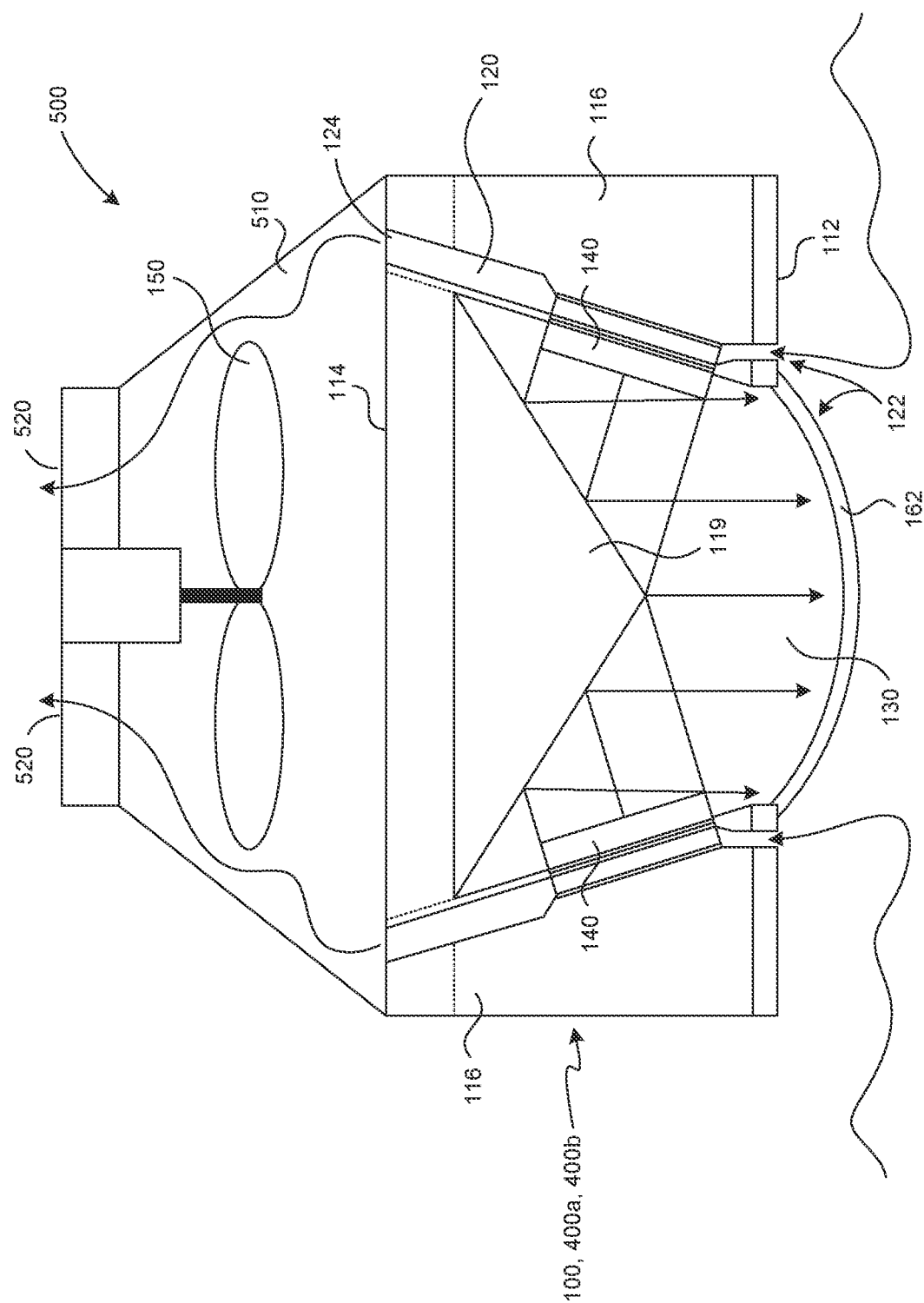
FIG. 5 is a partially schematic view of an SSL device having an air pressurizer and shroud in accordance with an embodiment of the present technology.

FIG. 5 illustrates an SSL device 500 according to further embodiments of the present technology that incorporates the SSL device 100 shown in FIG. 3A with an air pressurizer 150 within a shroud 510. The air pressurizer 150 can include a fan (as shown in FIG. 5) or any other pressurizing mechanism. In this embodiment, the air pressurizer 150 is positioned near the back 114 of the SSL device 500 and the shroud 510 covers the outlets 124 of the channel 120. The shroud 510 can include exhaust ports 520 through which the heated air is ejected from the SSL device 500. In other embodiments, other mechanisms for pressurizing the air can be used in place of (or in addition to) the air pressurizer 150. In some embodiments, the air pressurizer 150 can be placed at another location relative to the channels 120 and the SSEs 140. For example, a small fan (or a series of fans) can be positioned in the channels 120 or near the inlet 122 to force air through the channels 120 with positive pressure rather than pulling air with negative pressure. Other embodiments of the SSL device 500 can use the SSL devices 400*a* (FIG. 4A) and/or 400*b* (FIG. 4B) with the air pressurizer 150 and shroud 510 instead of the SSL device 100 (FIG. 3A).

Figure 6:
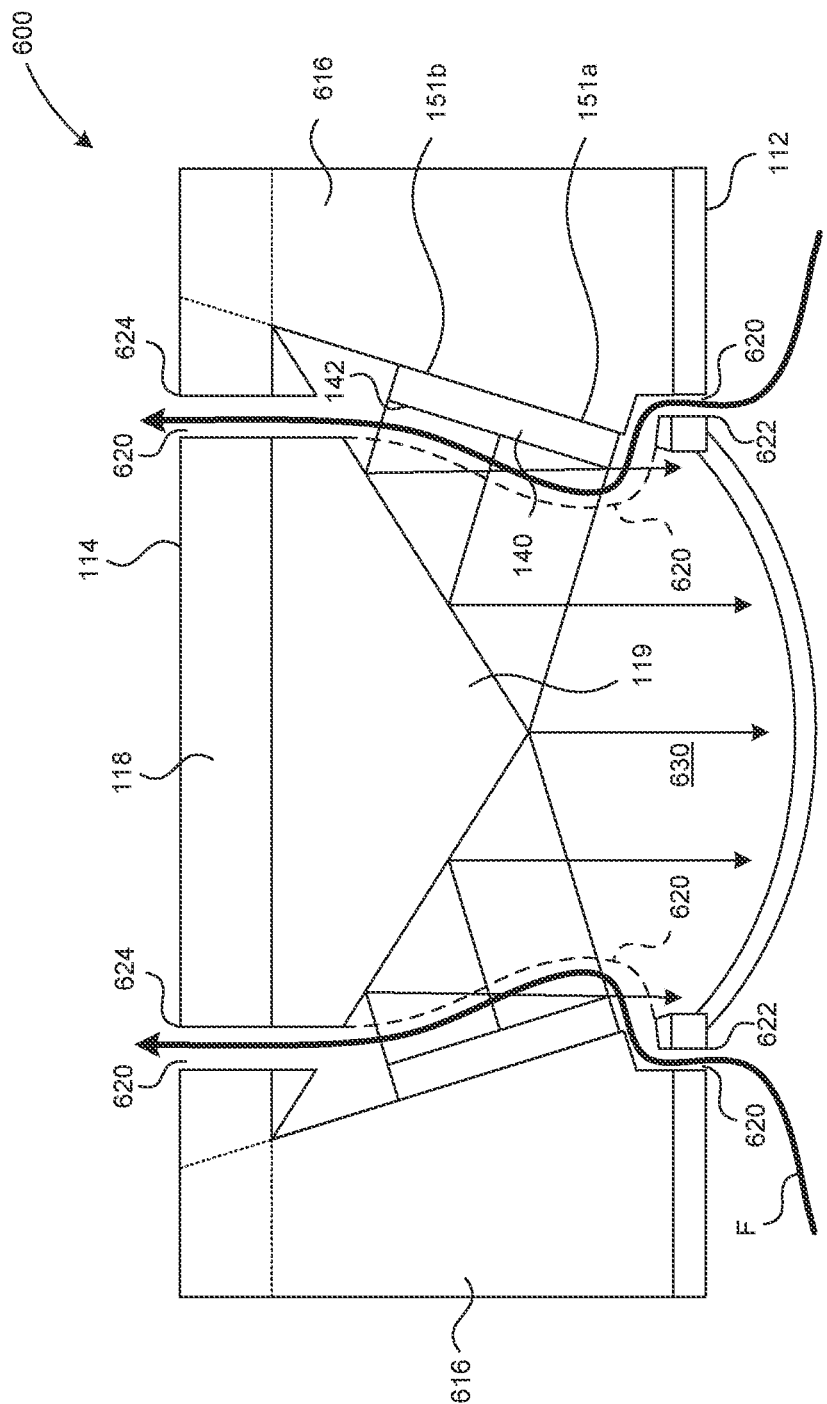
FIG. 6 is a partially schematic side view of an SSL device in accordance with an embodiment of the present technology.

FIG. 6 shows yet another SSL device 600 according to several embodiments of the present technology in which the active portions 142 of the SSEs 140 are mounted directly to the outer portion of a side section 616. The side section 616 along with the base 118 define a chamber 630. The side section 616 can include electrical contacts 151*a* and 151*b* electrically coupled to corresponding contacts of the SSEs 140, and the side section 616 can be sufficiently thermally conductive to operate as a heat sink for the SSEs 140. The SSL device 600 can further include a channel 620 that has an inlet 622 and an outlet 624. A portion of the channel 620 is a "virtual channel" (shown in dotted lines) that extends through the chamber 630 along the inner surface of the side section 616 and over the active portions 142 of the SSEs 140. Similar to other embodiments described above, the heated air in the chamber 630 rises and creates a passive, cooling air flow F that flows over the active portions 142 of the SSEs 140.

Figure 7:
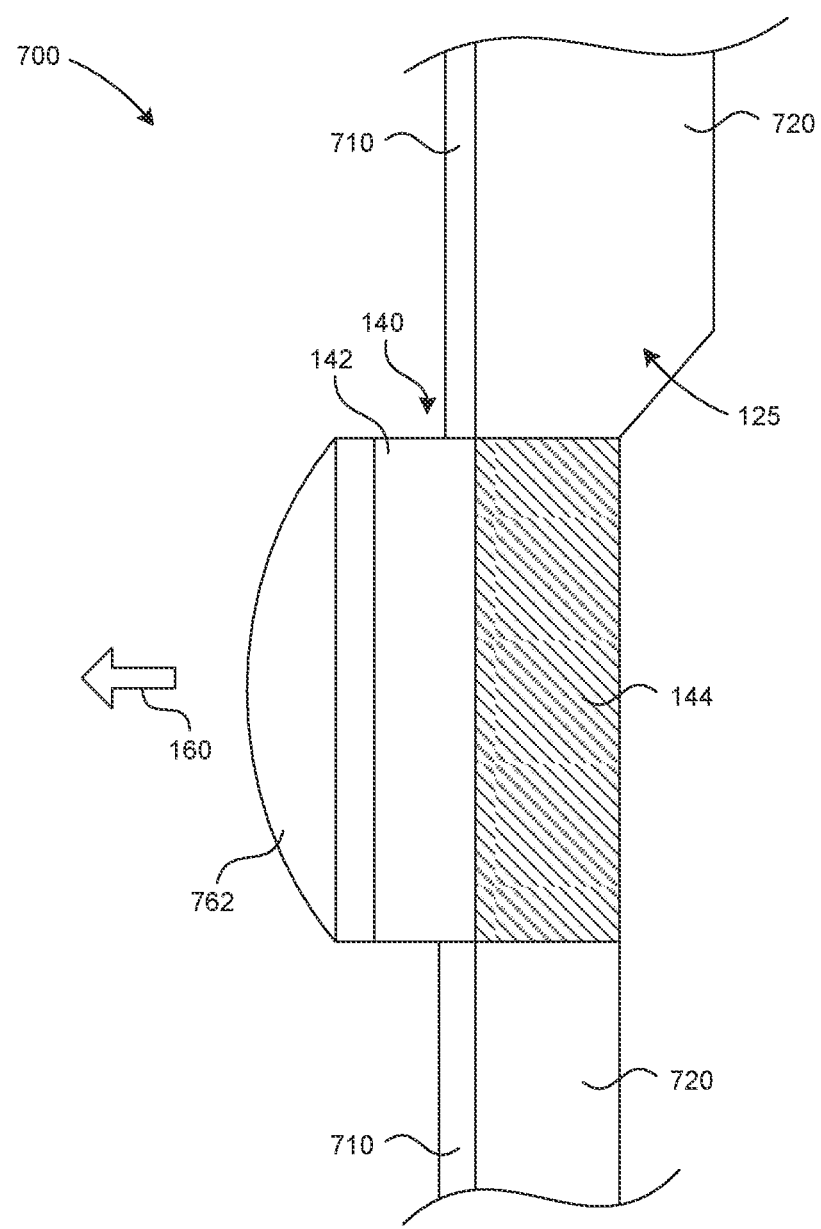
FIG. 7 is a partially schematic cross-sectional view of an SSL device in accordance with an embodiment of the present technology.

FIG. 7 illustrates an SSL device 700 in accordance with still further embodiments of the present technology. The SSL device 700 can include an SSE 140 with an active portion 142 and a thermally conductive back portion 144 with projections, such as fins or posts. The SSE 140 can have a lens 762 aligned with the active portion 142. The SSE 140 can be mounted to a support 710 including a channel 720 passing across the projections. The SSL device 700 can be situated to emit light in a generally horizontal direction 160 with the support 710 extending generally vertically such as on a wall, in a computer monitor or television set, or in another generally vertical structure. The channel 720 can be open to an ambient source of air at an inlet and/or outlet (not shown) of the channel 720. In some embodiments, the channel 720 can include an expansion zone 125 above the projections or a fan (not shown, similar to other embodiments) to further induce air flow across the projections. The projections can be electrically connected to the SSE 140 and to an external contact in the support 710.

The lenses 162 and 762 of the embodiments described above in FIGS. 3A-7 can be formed of injection molded silicone or other suitable material. The lenses 162 and 762 can include a converter material such as phosphor. When light from the SSEs 140 passes through the converter material, the converter material emits light of a desired color and quality. The converter material can be placed anywhere in an optical path of the SSEs 140, including on or in the lens 162 or another cover, or separate from a lens or cover. Alternatively, the converter material can be placed in a phosphor well. For example, in one embodiment, the converter material can include a phosphor containing cerium (III)-doped yttrium aluminum garnet (YAG) at a particular concentration for emitting a range of colors from green to yellow to red under photoluminescence. In other embodiments, the converter material can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, terbium-doped YAG, and/or other suitable phosphor compositions. The lenses 162 and 762 can simply transmit the light from the SSEs 140 and converter material or it can further focus or otherwise alter characteristics of the light.

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

Also, it will be appreciated that specific embodiments described above are for purposes of illustration and that various modifications may be made without deviating from the invention. Aspects of the technology described in the context of particular embodiments may be combined or eliminated in other embodiments. For example, the fan and motor can be replaced with other air-pressurizing mechanisms. Further, while advantages (e.g., heat dissipation mechanisms) associated with certain embodiments of the technology may have been described in the context of those embodiments, other embodiments may also exhibit such advantages, and not all embodiments need necessarily exhibit such advantages to fall within the scope of the technology. Accordingly, the present technology and associated technology can encompass other embodiments not expressly shown or described herein.

I claim:

1. A solid state lighting (SSL) device, comprising:
   a reflective surface angled relative to a primary direction of the SSL device by a non-zero first angle $\Phi$, wherein the reflective surface has a forward portion located further in the primary direction than a remainder of the reflective surface; and
   a solid state emitter (SSE) angled relative to the primary direction by a non-zero second angle $\theta$,
   wherein the first angle $\Phi$ and the second angle $\theta$ are configured so that light emitted from the SSE is reflected by the reflective surface in the primary direction of the SSL device, and
   wherein light emitted from a first peripheral region of the SSE is directed towards the forward portion of the reflector.

2. The SSL device of claim 1, wherein light emitted from a second peripheral region of the SSE opposite the first peripheral region is reflected by the reflective surface towards a first edge of the SSE.

3. The SSL device of claim 1, wherein reflective surface is planar.

4. The SSL device of claim 1, wherein reflective surface is a facet of a faceted reflector.

5. The SSL device of claim 4, wherein the faceted reflector is truncated and the forward portion of the reflective surface is a truncated edge of the faceted reflector.

6. The SSL device of claim 4, wherein facets of the faceted reflector converge at an apex, and wherein the forward portion of the reflective surface is adjacent the apex.

7. The SSL device of claim 1, wherein the reflective surface is curvate.

8. The SSL device of claim 1, wherein the reflective surface is conical.

9. The SSL device of claim 1, wherein the reflective surface is a truncated cone.

10. A solid state lighting (SSL) device, comprising:
    a reflector having a first reflective surface and a second reflective surface, each of the first and second reflective surfaces angled relative to a primary direction of the SSL device by a non-zero first angle $\Phi$, each of the first and second reflective surfaces having a forward portion further in the primary direction than a remainder of the corresponding reflective surface; and
    first and second solid state emitters (SSEs), each angled relative to the primary direction by a non-zero second angle $\theta$, wherein the first angle $\Phi$ and the second angle $\theta$ are configured so that light emitted from the first and second SSEs is reflected by the first and second reflective surfaces, respectively, in the primary direction of the SSL device,
    wherein light emitted from a first peripheral region of the first SSE is directed towards the forward portion of the corresponding first reflective surface, and
    wherein light emitted from a first peripheral region of the second SSE is directed towards the forward portion of the corresponding second reflective surface.

11. The SSL device of claim 10, wherein:
    light emitted from a second peripheral region of the first SSE opposite the first peripheral region thereof is reflected by the first reflective surface towards the first peripheral region of the first SSE, and
    light emitted from a second peripheral region of the second SSE opposite the first peripheral region thereof is reflected by the second reflective surface towards the first peripheral region of the second SSE.

12. The SSL device of claim 10, wherein the first and second reflective surface are each planar.

13. The SSL device of claim 10, wherein the reflector is faceted, and
    wherein the first and second reflective surface are each facets of the reflector.

14. The SSL device of claim 10, wherein the forward portion of the first reflective surface of the reflector and the forward portion of the second reflective surface of the reflector meet at a line.

15. The SSL device of claim 10, wherein the forward portion of the first reflective surface of the reflector and the forward portion of the second reflective surface of the reflector lie in a plane and are not parallel.

16. The SSL device of claim 10, wherein the forward portion of the first reflective surface of the reflector and the forward portion of the second reflective surface of the reflector meet at a point.

* * * * *